United States Patent [19]
Ohmi

[11] Patent Number: 5,372,647
[45] Date of Patent: Dec. 13, 1994

[54] APPARATUS FOR FORMING THIN FILM

[76] Inventor: Tadahiro Ohmi, 1-17-301, Komegabukuro, 2-chome, Aoba-ku Sendai-shi, Miyagi-ken, Japan, 980

[21] Appl. No.: 81,372
[22] PCT Filed: Dec. 27, 1991
[86] PCT No.: PCT/JP91/01796
§ 371 Date: Oct. 13, 1993
§ 102(e) Date: Oct. 13, 1993

[30] Foreign Application Priority Data

Jan. 1, 1991 [JP] Japan .................................. 3-10005

[51] Int. Cl.$^5$ ............................................. C23C 16/00
[52] U.S. Cl. ..................................... 118/719; 118/715; 414/217; 156/345
[58] Field of Search ................ 118/715, 719; 414/217; 156/345

[56] References Cited

U.S. PATENT DOCUMENTS

| 4,498,416 | 2/1985 | Bouchaib | 118/719 |
| 5,292,393 | 3/1994 | Maydan | 118/719 |

FOREIGN PATENT DOCUMENTS 55-163879 12/1980 Japan .
59-501727 10/1984 Japan .
62-104134 5/1987 Japan .
62-198122 9/1987 Japan .

Primary Examiner—Richard Bueker
Attorney, Agent, or Firm—Young & Thompson

[57] ABSTRACT

An apparatus for forming a thin film without spoiling contact resistances and breakdown voltage characteristics. The apparatus is so designed that at least one of first, second and third transferring means are kept in an atmosphere of an inert gas or of air of 10 ppb or less in moisture concentration, the first means being for transferring semiconductor substrate bodies from a device for exposing the surfaces of semiconductor substrate bodies to a device for forming conductive thin films on the exposed surfaces, the second means being for transferring substrate bodies from the device for exposing the surface of substrate bodies to a device for forming thermaloxidation films on the exposed surfaces, and the third means being for transferring substrate bodies from a device for exposing the surfaces of metallic wirings formed on substrate bodies to a device for forming a conductive thin film on the surfaces of the metallic wirings.

4 Claims, 4 Drawing Sheets

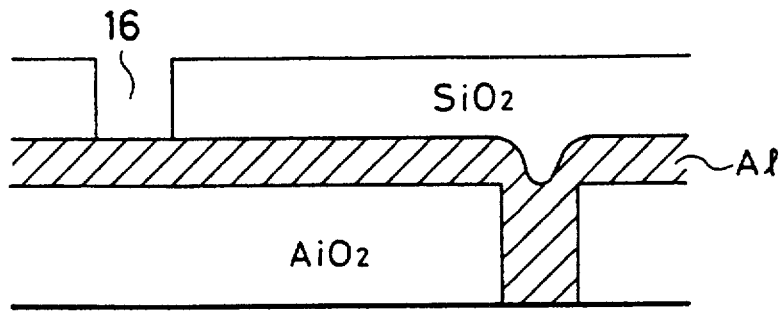
FIG. 5a
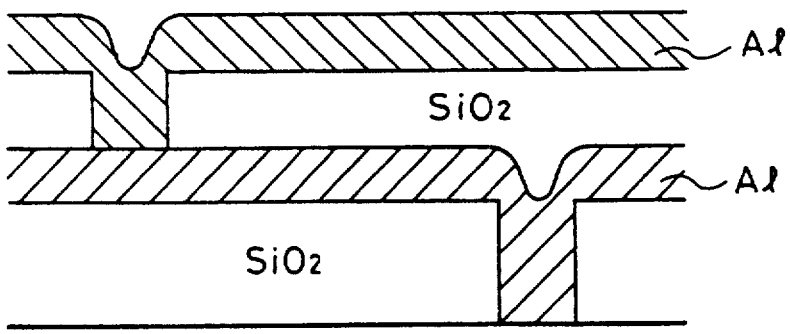
FIG. 5b
FIG. 6
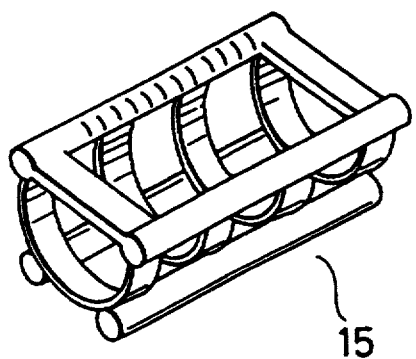

APPARATUS FOR FORMING THIN FILM

FIELD OF THE INVENTION

The present invention relates to an apparatus for forming thin film.

BACKGROUND ART

Hereinbelow, the background art will be explained using as an example a semiconductor wafer.

Conventionally, the transferring of wafers between apparatuses for film formation (insulation film, conductive film), etching, cleaning, and the like, was conducted in the Following manner. That is to say, for example, upon completion of film formation, the wafer was removed from the film formation apparatus and placed within a clean room, the wafer was then placed on a wafer carrier 15 such as that shown in FIG. 6 or the like, and this was then moved within the clean room to the apparatus in which the subsequent processes were conducted, for example, an etching apparatus.

However, upon investigation by the present inventors, it was discovered that even within a clean room, when the wafer was exposed to the atmosphere, a natural oxide film was formed on the wafer surface, and that contaminant elements such as Na, Fe, and the like, became attached to the wafer surface. That is to say, it cannot be assumed that the environment within a clean room is always "clean".

Furthermore, when formation of a conductive thin film was conducted in a state in which this type of natural oxide film had been formed or such contaminant elements had been attached, there was a risk that contact resistances would be spoiled, and furthermore, when the formation of a thermal oxidation film was conducted, there was a risk that breakdown voltage characteristics would be spoiled.

The present invention:has as an object thereof to provide an apparatus for forming a thin film which does not spoil contact resistances and breakdown voltage characteristics.

DISCLOSURE OF THE INVENTION

The above-described problems are solved by an apparatus for forming a thin film which is so, designed that at least one of a first, second, and third transferring means are kept in an atmosphere of an inert gas or of air having a moisture concentration of 10 ppb or less, the first transferring means being for transferring semiconductor substrate bodies from a device for exposing the surfaces of semiconductor substrate bodies to a device for forming conductive thin films on the exposed surfaces, the second transferring means being for transferring semiconductor substrate bodies from the device for exposing the surfaces of semiconductor substrates to a device for forming thermal oxidation films on the exposed surfaces, and the third transferring means being for transferring substrate bodies from a device for exposing the surfaces of metallic wirings formed on substrate bodies to a device for forming a conductive thin film on the surfaces of the metallic wirings.

The function of the present invention will be explained hereinbelow along with the detailed structure of the present invention.

Here, what is meant by a process for the exposure of a substrate body surface is a process, in which for example, in the state in which an insulation film is formed over the entire surface of a substrate, a portion of the insulation film is removed by means of reactive ion etching (RIE), thus forming a contact hole, and the substrate body surface is cleanly exposed.

Furthermore, what is meant by a process for the exposure of the surface of metallic wirings formed on a substrate body is a process, in which for example, in a state in which an insulation film is formed over the entire surface of a metal formed on a substrate body, a portion of the insulation film is removed by means of reactive ion etching, thus forming a through hole, and the surface of the metallic wirings formed on the substrate body surface is cleanly exposed.

The present inventors have discovered that, in the case in which a conductive thin film or a thermal oxidation film is to be formed on a surface exposed in this manner, the exposed surface must not be exposed to the atmosphere. That is to say, as noted above, it was discovered that, in the case in which a conductive thin film is to be formed, or in the case in which a thermal oxidation film is to be formed, when this exposed surface is exposed to the atmosphere, the contact resistances are spoiled, and the insulation breakdown voltage is spoiled.

As a result, in the present invention, a gas atmosphere having a moisture concentration of less than 10 ppb is maintained within the transferring mechanism.

It is possible to use inert gas ($N_2$ is also included among inert gasses) or air having a moisture concentration of less than 10 ppb as this gas. It Is preferable to use air having a moisture concentration of less than 10 ppb. That is to say, in the ease of inert gas, when a mistake is made during the transfer operation, and an operator must place his head inside the transfer mechanism, a state of oxygen deficiency will result. However, in the case in which air is used, such a state can be avoided. The discovery that air could be used in this manner was made for the first time by the present inventors. That is to say, it had been widely accepted that in a gas atmosphere containing oxygen, such as air, the surface of a substrate body or the surfaces of metallic wirings formed on a substrate body tended to suffer natural oxidation easily. However, after diligent research by the present inventors, it was discovered that if the moisture concentration were maintained at a level of 10 ppb or less, natural oxidation would not occur, even when oxygen was present. Accordingly, it is possible to use atmospheric air when purified so as to have a moisture concentration of less than 10 ppb. On the other hand, even if moisture is present, if oxygen is not present, the formation of a natural oxide film will not occur, so that accordingly, the use of an inert gas atmosphere is also possible. However, even in the case in which an inert gas is used, it is desirable that the moisture concentration be less than 10 ppb.

It is possible to use, as a transferring mechanism, in accordance with the present invention, for example, a structure such as that shown in FIG. 1, in which a RIE device 2, a wet cleaning device, an oxidizing device 4, and a device for forming conductive film are connected by a tunnel 1, this tunnel 1 is insulated from the atmosphere, and a gas having a moisture concentration of less than 10 ppb is caused to flow within tunnel 1. It is of course possible to connect devices other than devices 2–5.

Within this tunnel 1, gas is injected so as to make contact with the lower surfaces of the substrate body, and the substrate body are transferred in a state in which they float on said gas.

It is also possible to use a box 6, such as that shown in FIG. 2, where this box is filled with inert gas or air having a moisture concentration of less than 10 ppb.

In the present invention, in the case in which the exposed surface is, for example, the N+ region of a MOS transistor or a bipolar transistor, particularly striking results are obtained. That is to say, in accordance with the discovery of the present inventors, when a N+ region is exposed to the atmosphere within a clean room at room temperature, a natural oxide film having a thickness of 0.5 nm is formed essentially instantaneously. However, in the case in which an apparatus in accordance with the present invention is used, the formation of such a natural oxide film can be avoided.

Examples of the conductive thin film in accordance with the present invention include, for example, Al, Al-Si alloy, Al-Si-Cu alloy, Ti, Mo, Ta, N+ polysilicon, P+ polysilicon, and the like.

BRIEF DESCRIPTION OF THE DRAWINGS

FIGS. 5(a) and 5(b) are process diagrams showing a thin film formation process in accordance with a preferred embodiment of the present invention.

FIG. 6 is an angled view of a conventional transferring mechanism.

BEST MODE FOR CARRYING OUT THE INVENTION

Hereinbelow, the present invention will be explained with reference to preferred embodiments.

EMBODIMENT 1

Figure 1:
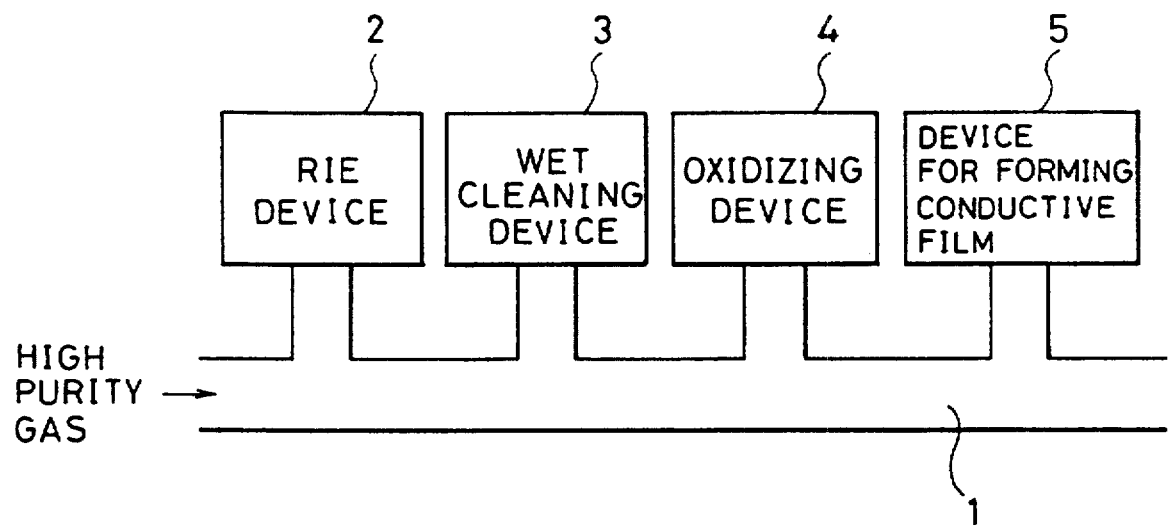
FIG. 1 is a conceptual diagram showing an example of a transferring mechanism in accordance with the present invention.
Figure 2:
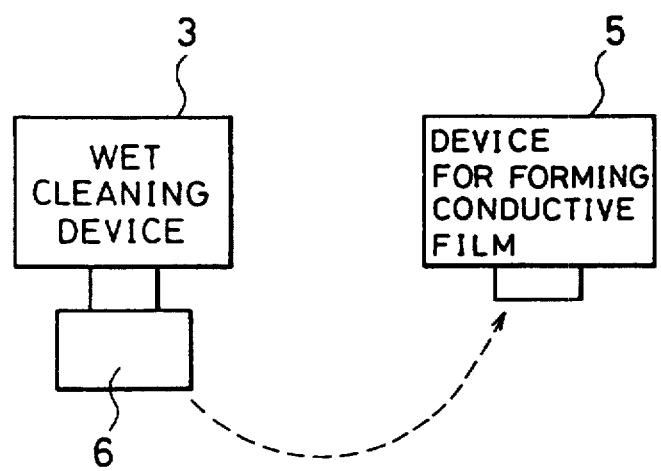
FIG. 2 is a conceptual diagram showing another example of a transferring mechanism in accordance with the present invention.

Film formation was conducted using the device shown in FIG. 1 and following the order shown in FIG. 2.

Figure 3A:
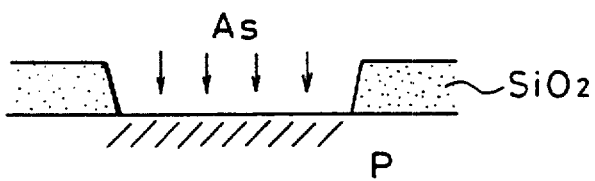
FIGS. 3(a), 3(b), 3(c), 3(d) and 3(e) are process diagrams showing a thin film formation process in accordance with a preferred embodiment of the present invention.
Figure 3B:
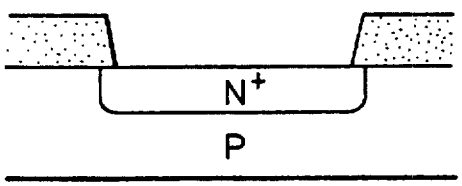
Figure 3C:
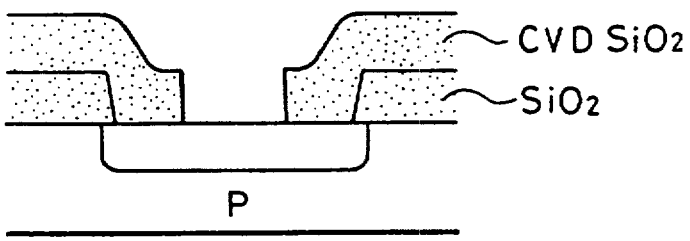
Figure 3D:
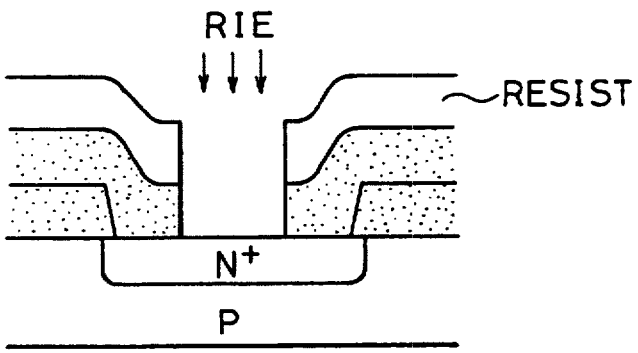
Figure 3E:
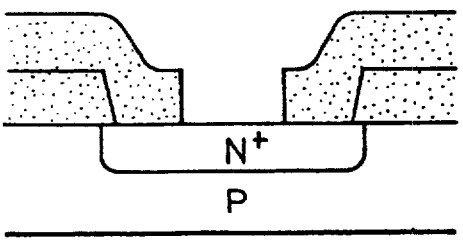

After As ion implantation was conducted on a region encompassing a part of a P-Si wafer (FIG. 3(a)), annealing was conducted, and a N+ region was formed (FIG. 3(b)). Next, the wafer was transported to a CVD device, and a $SiO_2$ film was formed over the entire surface thereof (FIG. 3(c)). Next, a resist formation process and a resist patterning process by means of photolithography were conducted, and a contact hole was formed by means of RIE ((FIG. 3(d), (e)).

Figure 4:
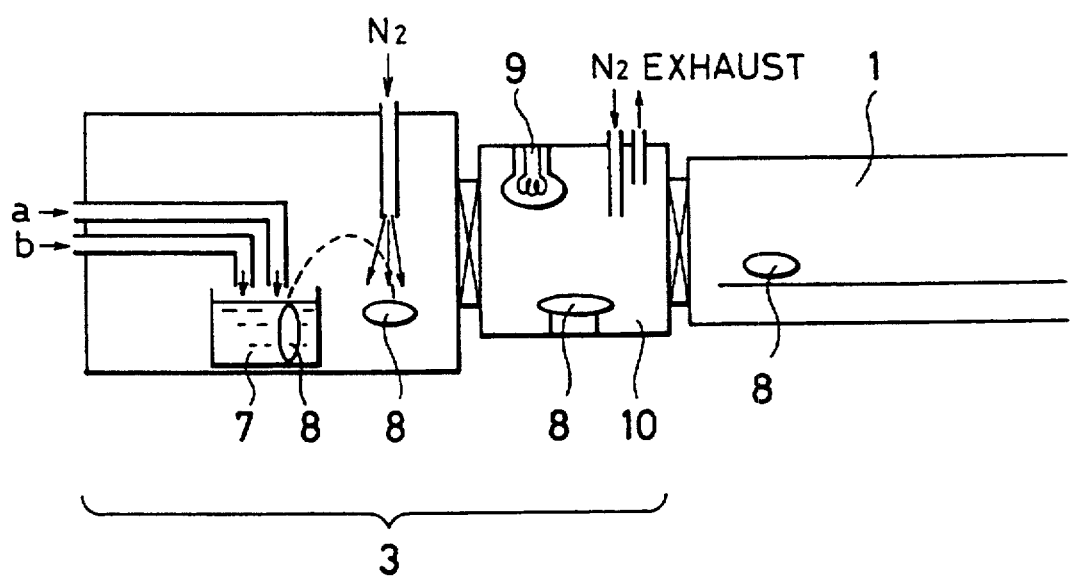
FIG. 4 is an expanded view of the wet cleaning device of FIG. 1.
Figure 3A:
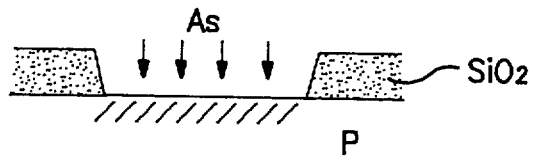
Figure 3B:
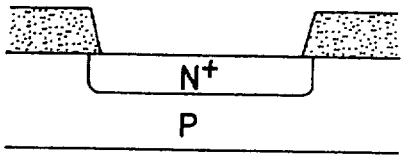
Figure 3C:
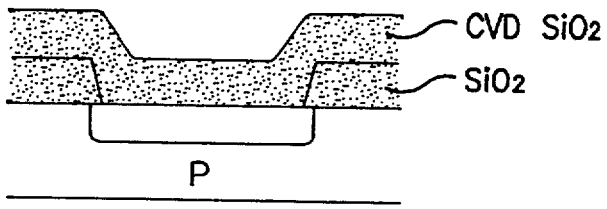
Figure 3D:
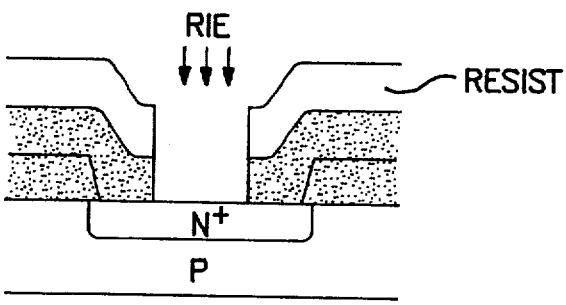
Figure 3E:
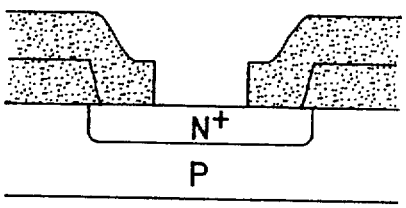

Subsequently, wafer 8 was transferred to the interior of a wet cleaning device 3 such as that shown in FIG. 4, this was immersed in an etching liquid 7, and resist stripping was conducted. Next, wafer 8 was transferred to a $N_2$ blow chamber 10, the wafer was heated by means of a lamp 9 during $N_2$ blow, and moisture was removed. Next, after this chamber was placed in a vacuum state, $N_2$ gas was again introduced.

By means of the above processes, an exposure process which obtained a N+ region having a clean surface was completed.

This wafer was transferred to a device 5 for forming conductive film through the medium of tunnel 1, through the interior of which air having a moisture concentration of less than 10 ppb was continuously caused to flow, and Al film formation was conducted (embodiment).

For the purpose of comparison, after the completion of the exposure process in which a N+ region having a clean surface was obtained, the wafer was transferred to a chamber for conductive film formation after being placed temporarily within a clean room, and Al film formation was conducted (comparative example).

The contact resistances of both wafers were compared, and it was discovered that the contact resistance of the embodiment was approximately ¼ the contact resistance of the comparative example.

EMBODIMENT 2

Prior to the formation of surface film, a semiconductor wafer was transferred to the RIE device 2, and the surface thereof was irradiated with ions having an energy level within a range of ones of eV to tens of eV, and thereby, impurities adhering to the wafer surface and natural oxide films were removed, and thus the surface of the semiconductor substrate body was exposed. Subsequently, the wafer was transferred to the interior of an oxidizing device through the medium of a tunnel 1 through which $N_2$ gas was continuously caused to flow, and by means of thermal oxidation within oxidizing device 4, a $SiO_2$ film was formed on the wafer surface. Next, a MOS transistor having this $SiO_2$ film as a gate insulation film was formed on this wafer by means of the CVD method (embodiment).

For the purposes of comparison, after the RIE device 2 stage, a wafer was placed for a time in a clean room, and after this, the wafer was transferred to an oxidizing device 4, and a MOS transistor was formed in a manner identical to that of the above-described preferred embodiment.

The insulation breakdown frequency of the plurality of MOS transistors formed on the wafers was determined for both wafers, and in the ease of the preferred embodiment, the number of transistors in which insulation breakdown occurred was approximately half the number occurring in the case of the comparative example.

EMBODIMENT 3

In the present example, an element having the multilayer wiring structure shown in FIG. 5 was produced.

The formation of through hole 16 was conducted in wet cleaning device 3 in a manner identical to that of the first preferred embodiment, and the substrate body in the state shown in FIG. 5(a) was transferred to device 5 for forming conductive film, shown in FIG. 1, through the medium of tunnel 1, through which air having a moisture concentration of less than 10 ppb was constantly caused to flow, Al film formation was conducted, and the element shown in FIG. 5(b) was produced (embodiment).

For the purposes of comparison, after removal from wet cleaning device 3, the substrate body was placed for a time within a clean room, and after this, was transferred to device 5 for forming conductive film, and Al film formation was conducted (comparative example).

When the contact resistances of both wafers were compared, it was discovered that the contact resistance of the embodiment was approximately ¼ the contact resistance of the comparative example.

Industrial Applicability

In accordance with the present invention, it is possible to provide an apparatus for forming thin films which is capable of producing elements having superior contact resistance and breakdown voltage characteristics.

I claim:

1. An apparatus for forming a thin film, wherein
   a first transferring means for transferring semiconductor substrate bodies from a device for exposing surfaces of said semiconductor substrates to a device for forming conductive thin films on exposed surfaces,
   a second transferring means for transferring semiconductor substrate bodies from said device for exposing surfaces of semiconductor substrate bodies to a device for forming thermal oxidation films on exposed surfaces, and
   a third transferring means for transferring substrate bodies from a device for exposing surfaces of metallic wirings formed on said substrate bodies to a device for forming a conductive thin film on surfaces of said metallic wirings,
   are provided, and at least 1 of said first, second, and third transferring means are maintained in an atmosphere of an inert gas or of air having a moisture concentration of 10 ppb or less.

2. An apparatus for forming a thin film in accordance with claim 1, wherein at least 1 of said transferring means is capable of transferring said substrate bodies in a floating manner by means of jetting of a gas onto said substrate bodies.

3. An apparatus for forming a thin film in accordance claim 1, wherein said process for exposing surfaces of semiconductor substrate bodies is a process for exposing surfaces of $N^+$ regions formed on semiconductor substrate body surfaces covered by means of insulation films or resist films.

4. An apparatus for forming a thin film in accordance with claim 3, wherein said $N^+$ region is a source/drain region of an MOS transistor, or is an emitting region of a bipolar transistor.

* * * * *

UNITED STATES PATENT AND TRADEMARK OFFICE
CERTIFICATE OF CORRECTION

PATENT NO. : 5,372,647
DATED : Dec. 13, 1994
INVENTOR(S) : Tadahiro Ohmi

It is certified that error appears in the above-identified patent and that said Letters Patent is hereby corrected as shown below:

Delete drawing Figs. 3a-3e, and substitute therefor the drawing Figs. 3a-3e, as shown on the attached page.

Signed and Sealed this

Twentieth Day of October, 1998

Attest:

BRUCE LEHMAN

*Attesting Officer*  *Commissioner of Patents and Trademarks*